United States Patent [19]

Pack

[11] Patent Number: 5,521,575
[45] Date of Patent: May 28, 1996

[54] KEY SIGNAL INPUT CIRCUIT FOR MICROCOMPUTER

[75] Inventor: Bok H. Pack, Kyungki-do, Rep. of Korea

[73] Assignee: Gold Star Co., Ltd., Seoul, Rep. of Korea

[21] Appl. No.: 876,797

[22] Filed: May 1, 1992

[30] Foreign Application Priority Data

May 4, 1991 [KR] Rep. of Korea ............. 6375/1991

[51] Int. Cl.⁶ .................................................. H03M 11/00
[52] U.S. Cl. ............................. 341/26; 341/20; 341/24
[58] Field of Search ............................ 341/20, 22, 26, 341/176, 31, 33, 24; 364/189, 709.01; 400/473; 179/17 C

[56] References Cited

U.S. PATENT DOCUMENTS

| | | | |
|---|---|---|---|
| 4,583,189 | 4/1986 | Koyama | 341/26 |
| 4,872,008 | 10/1989 | Ohtsuka et al. | 341/26 |
| 4,918,634 | 4/1990 | Nishimori | 341/22 |
| 5,057,836 | 10/1991 | Inaba | 341/22 |
| 5,182,769 | 1/1993 | Yamaguchi et al. | 379/355 |

FOREIGN PATENT DOCUMENTS

| | | | |
|---|---|---|---|
| 0214940 | 12/1984 | Japan | 341/26 |
| 0016818 | 1/1990 | Japan | 341/22 |

*Primary Examiner*—John K. Peng
*Assistant Examiner*—Daniel J. Wu
*Attorney, Agent, or Firm*—Finnegan, Henderson Farabow, Garrett & Dunner

[57] ABSTRACT

A key signal input circuit for a microcomputer including a microprocessor and a single input port. The microcomputer outputs, in sequence at a constant interval, a plurality of grid signals, receives different key signal inputs successively through the single input port synchronously with the grid signals, and discriminates the inputted key signals to recognize which keys have been selected. The key signal input circuit includes a power supply circuit, responsive to the grid signals from the microcomputer, having a plurality of power supply lines for supplying, in sequence at a constant interval, a desired power through the power supply lines. A key matrix circuit having a plurality of sets of keys, responsive to the desired power through the power supply lines from the power supply circuit and to on/off states of the keys, coupled, by sets, respectively to the power supply lines. The key matrix circuit applies the key signals successively to the microcomputer.

9 Claims, 5 Drawing Sheets

F I G. 1 PRIOR ART

KEY SIGNAL INPUT CIRCUIT FOR MICROCOMPUTER

BACKGROUND OF THE INVENTION

1. Field of the Invention

The present invention relates in general to a microcomputer, and more particularly to a key signal input circuit for a microcomputer, while the number of pins of the microcomputer is reduced.

2. Description of the Prior Art

A microcomputer has commonly been employed in most electronic equipments.

Figure 1:
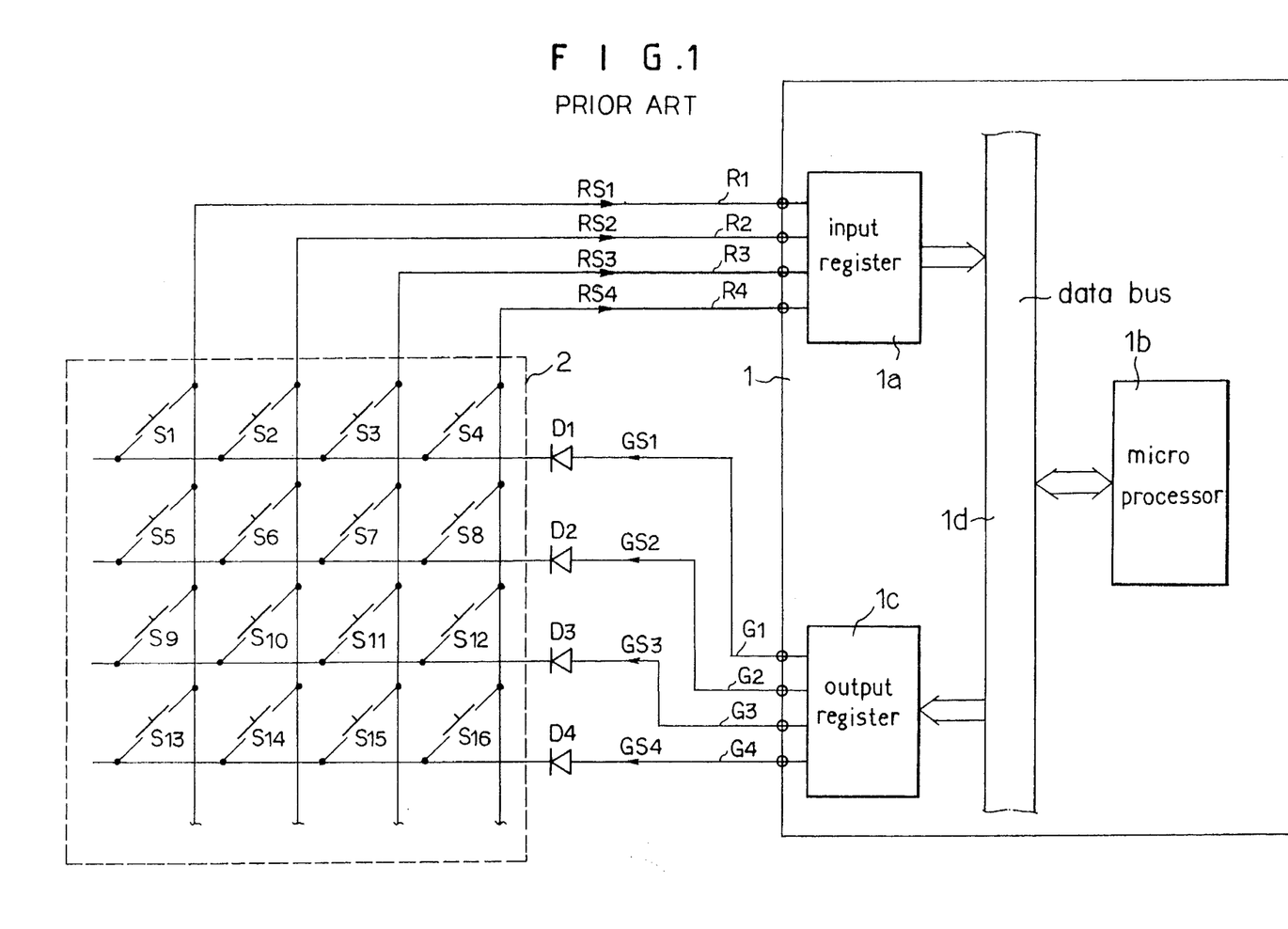
FIG. 1 is a circuit diagram of a key signal input circuit for a microcomputer in accordance with an embodiment of the prior art.

Referring to FIG. 1, there is shown an example of a key signal input circuit for such a microcomputer in circuit form. In FIG. 1, a microcomputer 1 is adapted to output four drive grid signals GS1–GS4 and to input four key signals RS1–RS4. A key matrix circuit 2 includes push button switches S1–S16 that are responsive to the grid signals GS1–GS4 from the microcomputer 1 and to on/off states of the push button switches S1–S16, and outputs the key signals RS1–RS4. The grid signals GS1–GS4 from the microcomputer 1 are transmitted to the key matrix circuit 2, respectively, over four grid lines G1–G4 and through four diodes D1–D4. The key signals RS1–RS4 from the key matrix circuit 2 are transmitted over four return tines R1–R4 to input ports of the microcomputer 1, respectively.

The microcomputer 1 comprises input register 1a for storing temporarily the key signals RS1–RS4 inputted respectively over the return lines R1–R4 and then outputting the key signals RS1–RS4, a microprocessor 1b for sensing on/off states of the push button switches 1–16 in response to the key signals RS1–RS4 from the input register 1a and providing the grid signals GS1–GS4, an output register 1c for storing temporarily the grid signals GS1–GS4 from the microprocessor 1b and then outputting the grid signals GS1–GS4 respectively to the grid lines G1–G4, and a data bus 1d coupled among the input register 1a, the output register 1c and the microprocessor 1b for data input/output to/from the microprocessor 1b.

In key matrix circuit 2, one terminal of each of the push button switches S1–S4 is connected to the grid line G1 and one terminal of each of the push button switches S5–S8 is connected to the grid line G2. Similarly, one terminal of each of the push button switches S9–S12 is connected to the grid line G3 and one terminal of each of the push button switches S13–S16 is connected to the grid line G4. The return lines R1–R4 are arranged perpendicularly to the grid lines G1–G4. The other terminal of each of the push button switches S1, S5, S9 and S13 is connected to the return line R1 and the other terminal each of the push button switches S2, S6, S10 and S14 is connected to the return line R2. Similarly, the other terminal of each of the push button switches S3, S7, S11 and S15 is connected to the return line R3 and the other terminal of each of the push button switches S4, S8, S12 and S16 is connected to the return line R4. As mentioned, the combination of the push button switches with the lines has a key matrix form.

The operation of the construction of FIG. 1 will now be described with reference to FIGS. 2 and 3.

During operation, the grid signals GS1–GS4 are successively outputted from the microprocessor 1b respectively to the grid lines G1–G4 aligned in the horizontal direction in such a manner that high signals of predetermined pulse width t1 are in sequence and applied respectively to the grid lines G1–G4 at a constant interval t2, as shown in FIGS. 2A to 2D. In response to the key signals RS1–RS4 inputted respectively over the return lines R1–R4 aligned in the vertical direction, the microprocessor 1b senses on/off states of the push button switches S1–S16.

Figure 2A:
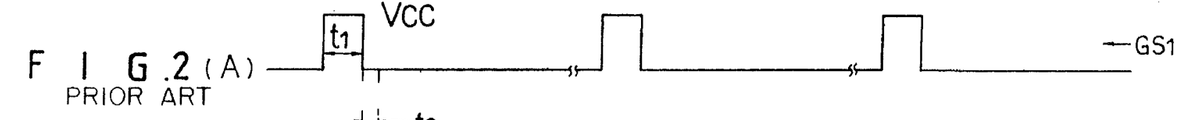
FIGS. 2A to 2I are waveform diagrams of signals from respective components in FIG. 1.
Figure 2B:
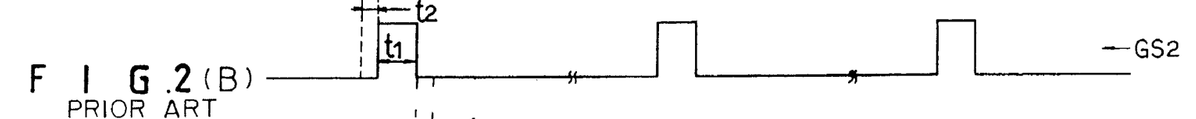
Figure 2C:
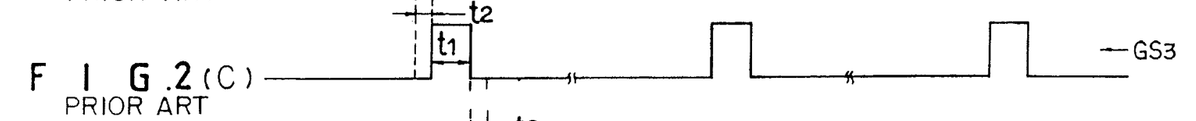
Figures 2D, 2E, 2F:
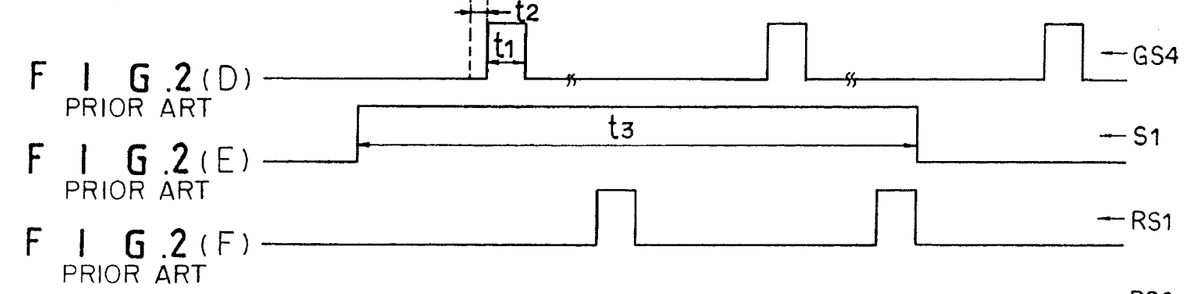
Figure 2G:
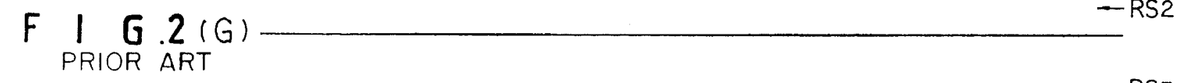
Figure 2H:
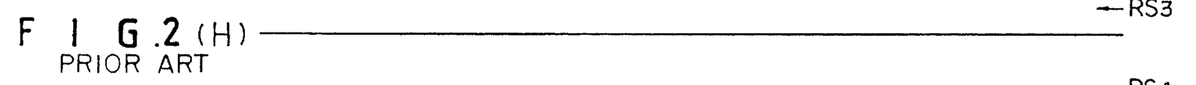
Figure 2I:
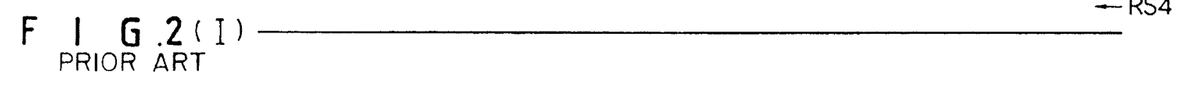
Figure 3:
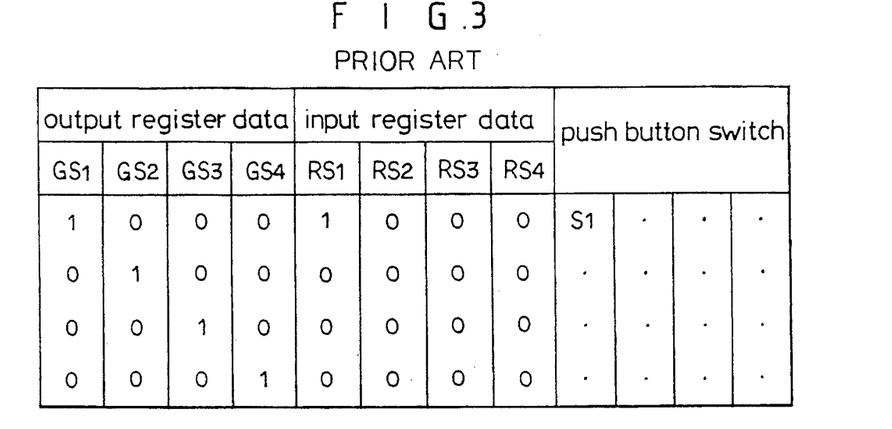
FIG. 3 is a table illustrating a relationship among output register data, input register data, and push button switches in accordance with the embodiment of the prior art.

For example, as shown in FIG. 3, assuming that the grid signal GS1 is high (logical value "1"), the grid signals GS2–GS4 are all low (logical value "0") and the key signal RS1 of high level is applied to the input register 1a, the microprocessor 1b senses the state (pushed state) of the push button switch S1 as being on. In other words, when the grid signal GS1 is high and the grid signals GS2–GS4 are all low while the push button switch S1 is activated for a period of time t3 as shown in FIG. 2E, the key signal RS1 that is applied to the input register 1a become high as shown in FIG. 2F. This results in the pushed or activated state of the push button switch S1 that is recognized by the microprocessor 1b. At this time, the other key signals RS2–RS4 are all low as shown in FIGS. 2G to 2I, respectively.

In this manner, the microprocessor 1b outputs successively, in order, the grid signals GS1–GS4 of high level respectively to the grid lines G1–G4. The microprocessor 1b determines the activated states of the push button switches S1–S16 in accordance with the input states of the key signals RS1–RS4 corresponding to each event.

Figures 4, 7:
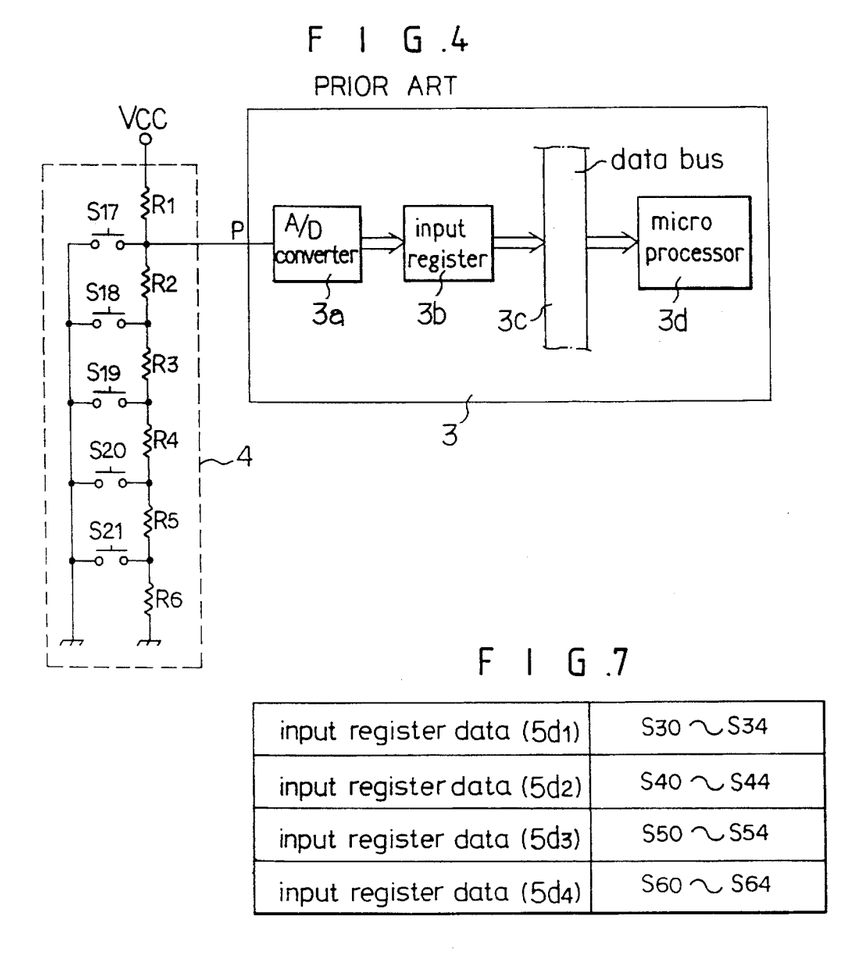
FIG. 4 is a circuit diagram of a key signal input circuit for a microcomputer in accordance with another embodiment of the prior art.
FIG. 7 is a table illustrating a relationship between input register data and push-button switches in accordance with the embodiment of the present invention.

Referring to FIG. 4, another example of a key signal input circuit for a microcomputer is shown in circuit form. In FIG. 4, there are no grid lines and only one return line over which a key signal is transmitted for determination of the activated states of push button switches in accordance with its signal magnitude. This results in a reduction in the number of ports of the microcomputer.

A microcomputer 3 has a single input port, and a key matrix circuit 4 consists of a plurality of push button switches 17–21 and a plurality of resistors R1–RG.

The microcomputer 3 includes an analog/digital (A/D) converter 3a for converting a key signal transmitted over the return line from the key matrix circuit 4 into a digital signal and input register 3b for storing temporarily the digital signal from the analog/digital converter 3a and then outputting the digital signal. The microcomputer 3 also includes a microprocessor 3d for discriminating the activated states of the push button switches S17–S21 in accordance with the digital signal from the input register 3b and a data bus 3c coupled between the input register 3b and the microprocessor 3d for transmitting of the digital signal therebetween.

In the key matrix circuit 4, the pull-up resistors R1–R6 are connected in order and in series with respect to one another between a DC power source Vcc and a ground GND. The push button switches S17–21 are connected respectively between the ground GND and respective connection points of adjacent ones of the resistors R1–R6 as shown in FIG. 4.

The operation of the construction of FIG. 4 will now be described.

During operation, if any one of the push button switches S17–S21 is activated, a corresponding one of the series connected resistors R1–R6 is selected, resulting in a variation in the total resistance of the resistors. Then, a voltage that is divided by the varied total resistance is inputted through an input port P to the analog/digital converter 3a in the microcomputer 3. The input voltages is converted into digital data by the analog,/digital converter 3a and the digital data is applied to the input register 3b. The digital data is temporarily stored in the input register 3b and is then transmitted to the microprocessor 3d over the data bus 3c. The microprocessor 3d discriminates the activated states of the push button switches S17–S21 by analyzing the digital data.

However, the above-mentioned techniques have disadvantages as follows. The key signal input circuit in FIG. 1 has a disadvantage, in that, the number of transmission lines for data input/output are large. Namely, the number of the transmission lines required by the microcomputer is eight including 4 grid lines and 4 return lines. The key signal input circuit in FIG. 1 employs 16 available conditions due to a characteristic of the key matrix circuit. Nevertheless 256 ($2^8$) events corresponding to the eight lines can occur at a maximum. This results in a low degree of efficiency in the circuit. On the other hand, the key signal input circuit in FIG. 4 is desirable in order to reduce the number of ports since only a single line is merely required by the microcomputer. However, this circuit has a disadvantage of limiting the number of events since the activated states of the push button switches must be discriminated on the basis of differences among a series of total resistances. Further, signals of transient state may be produced at a short period by the push button switches and a noise may be introduced from the ground. These disadvantageous can result in a malfunction of the microcomputer.

SUMMARY OF THE INVENTION

Therefore, the present invention has been made in view of the above problems, and it is an object of the present invention to provide a key signal input circuit for a microcomputer, that can perform the input of a key signal to the microcomputer through a single port, while the number of pins of an integrated circuit is reduced in number.

In accordance with the present invention, the above object can be accomplished by providing a key signal input circuit for a microcomputer, comprising: key recognizing means having a single input port, the key recognizing means outputting, in sequence and at a constant interval, a plurality of grid signals, inputting different key signals successively through the single input port synchronously with the grid signals, and discriminating the inputted different key signals to recognize which keys have been selected; power supply means having a plurality of power supply lines and responsive to the grid signals from said key recognizing means for supplying, in sequence and at a constant interval, a desired power through the power supply lines; and key signal generating means having a plurality of sets of keys coupled, by sets, respectively to the power supply lines and responsive to the desired power through the power supply lines from the power supply means and to on/off states of the keys for applying the different key signals successively to the key recognizing means,

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENT

First, a construction of a key signal input circuit for a microcomputer in accordance with an embodiment of the present invention will be described with reference to FIG. 5.

Figure 5:
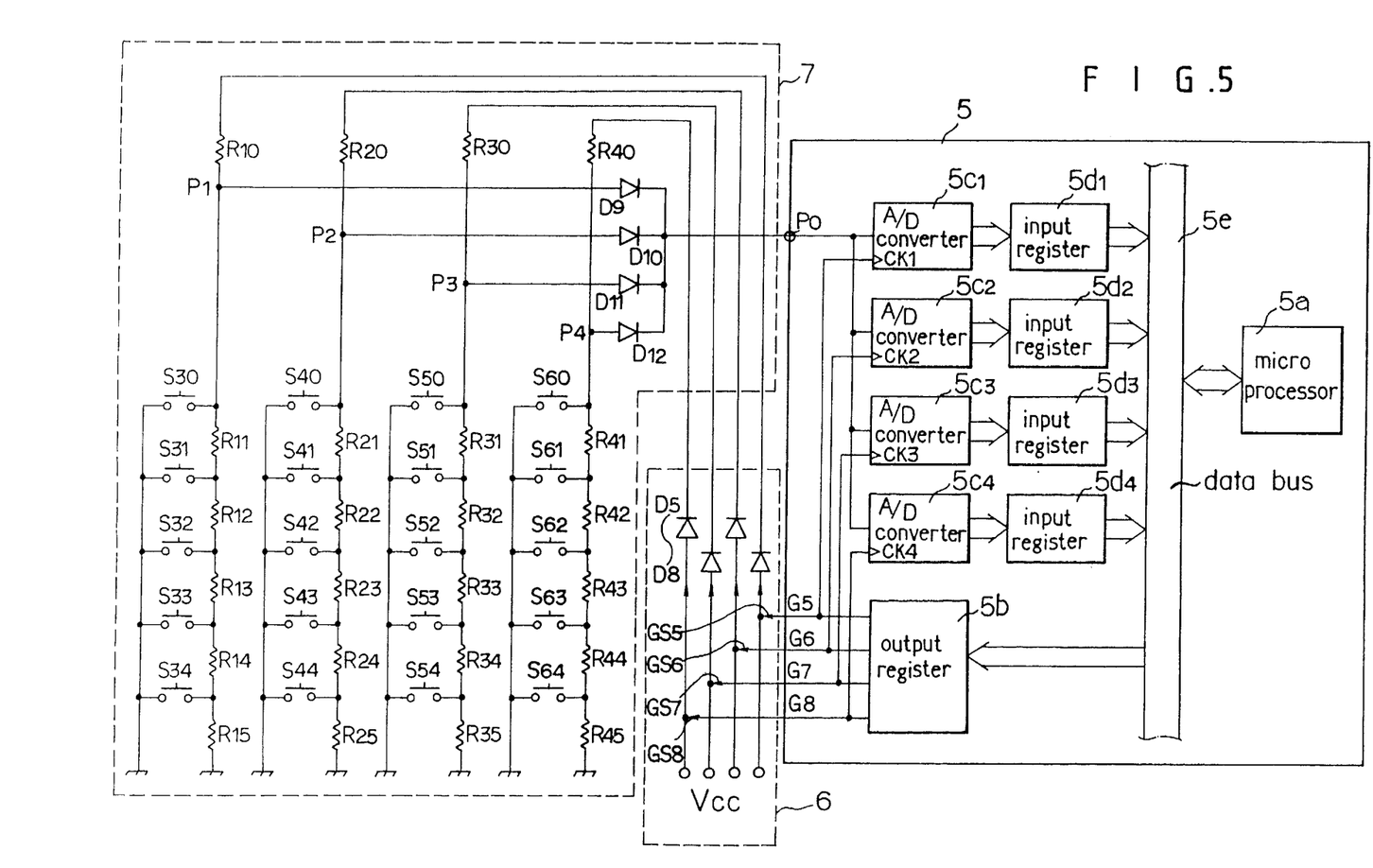
FIG. 5 is a circuit diagram of a key signal input circuit for a microcomputer in accordance with an embodiment of the present invention.

As shown in FIG. 5, the key signal input circuit includes a microcomputer 5 for outputting in sequence four grid signals GS5–GS8 respectively to grid lines G5–G8 and inputting a single key signal, a power supply circuit 6 having four reverse voltage preventing diodes D5–D8, for transferring or blocking a DC power Vcc in accordance with the grid signals GS5–GS8 from the microcomputer 5, and a key matrix circuit 7 including twenty push button switches S30–S34, S40–S44, S50–S54 and S60–S64 as keys. The key matrix circuit 7, in response to the DC power Vcc through the power supply circuit 6 and to on/off states of the push button switches S30–S34, S40–S44, S50–S54 and S60–S64 applies a corresponding single key signal to the microcomputer 5.

The microcomputer 5 includes a microprocessor 5a for producing the grid signals GS5–GS8 and recognizing an activated or a selected, push button switch in response to the inputted key signal, and an output register 5b for storing temporarily the grid signal s GS5–G88 from the microprocessor 5a and then outputting, in sequence and at a constant interval, the grid signals G5–G8. The microcomputer 5 also includes respectively to the grid lines G5–G8, four analog/digital converters 5c1–5c4 for inputting the single key signal from the key matrix circuit 7 simultaneously and the grid signals GS5–GS8 from the output register 5b respectively as their drive clock signals CK1–CK4 and each for converting the single key signal into a digital signal during a driving interval. The microcomputer 5 also includes four input registers 5d1–5d4, each for storing temporarily a corresponding one of the digital signals from the analog/digital converters 5c1–5c4 and then outputting the digital signal. The microcomputer 5 further includes a data bus 5e coupled among the microprocessor 5a, the output register 5b, and the input registers 5d1–5d4 for transferring the digital signals from the input registers 5d1–5d4 therethrough to the microprocessor 5a or the grid signal s GS5–GS8 from the microprocessor 5a therethrough to the output register 5b.

In the key matrix circuit 7, pull-up resistors R10, R20, R30 and R40 are connected respectively to the cathodes of the diodes D5–D8 in the power supply circuit 6. Resistors R11–R15 are connected in order and in series with respect to one another between the pull-up resistor R10 and a ground GND. The push button switches S30–S34 are connected respectively between the ground GND and respective connection points of adjacent ones of resistors R10–R15. Resistors R21–R25 are in order connected in order and in series with respect to one another between the pull-up resistor R20 and the ground GND. The push button switches S40–S44 are connected respectively between the ground GND and respective connection points of adjacent ones of resistors R20–R25. Resistors R31–R35 are connected in order and in series with respect to one another between the pull-up resistor R30 and the ground GND. The push button switches S50–S54 are connected respectively between the ground GND and respective connection points of adjacent ones of resistors R30–R35. Resistors R41–R45 are connected in order and in series with respect to one another between the pull-up resistor R40 and the ground GND. The push button switches S60–S64 are connected respectively between the ground GND and respective connection points of adjacent ones of resistors R40–R45. Also, the, key matrix circuit 7 includes four reverse voltage preventing diodes D9–D12 that have their anodes connected respectively to connection points P1–P4 of resistors R10 and R11, resistors R20 and R21, resistors R30 and R31 and the resistors R40 and R41. The cathodes are connected commonly to the inputs of the analog/digital converters 5c1–5c4.

Now, the operation of the embodiment of FIG. 5 will be described in detail with reference to FIGS. 6 and 7.

During operation, the grid signals or strobe signals GS5–GS8 are successively outputted through the output register 5b respectively to the grid lines G5–G8 in such a manner that high signals of predetermined pulse width t4 are in sequence and applied respectively to the grid lines G5–G8 at a constant interval t5, as shown in FIGS. 6A to 6D. In this manner, the grid signals GS5–GS8 of high level are in sequence and at the constant interval t5 and applied respectively to the anodes of the diodes D5–D8 over the grid lines G5–G8 and simultaneously to the clock terminals of the analog/digital converters 5c1–5c4 as the drive clock signals CK1–CK4. For example, the analog/digital converter 5c1 is driven for a period when the grid signal GS5 is applied thereto. The pulse width t4 is preselected for determination of the activated states of the push button switches S30–S34, S40–S44, S50–S54 and S60–S64. The diodes D5–D8 conduct in order by the sequential grid signals GS5–GS8 of high level over the grid lines G5–G8, thereby causing the DC power to be supplied in sequence through the grid lines G5–G8 to the key matrix circuit 7. This results in a generation of voltages of different time constants at the connection points P1–P4 on the basis of the activated states of the push button switches S30–S34, S40–S44, S50–S54 and S60–S64. The voltages generated corresponding to the activated state of any one of the push button switches S30–S34, S40–S44, S50–S54 and S60–S64 are applied as a single key signal to an input port P0 through the diodes D9–D12. The applied key signal is transmitted to the microprocessor 5a through a corresponding one of the analog/digital converters 5c1–5c4, a corresponding one of the input registers 5d1–5d4 and the data bus 5e. In response to this key signal, the microprocessor 5a determines which one of the push button switches S30–S34, S40–S44, S50–S54 and S60–S64 has been activated.

Figure 6A:
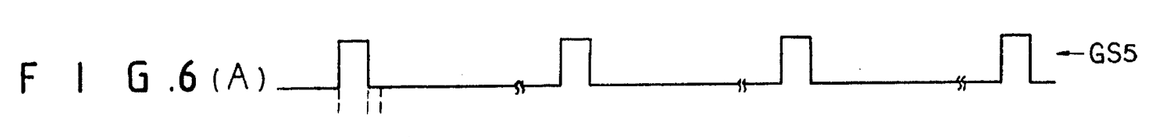
FIGS. 6A to 6J are waveform diagrams of signals from respective components in FIG. 5.
Figure 6B:
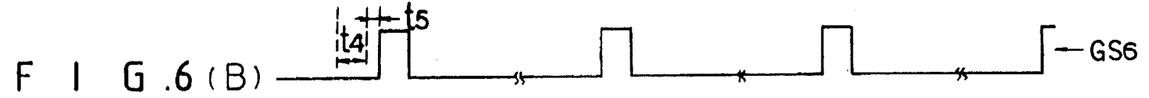
Figure 6C:
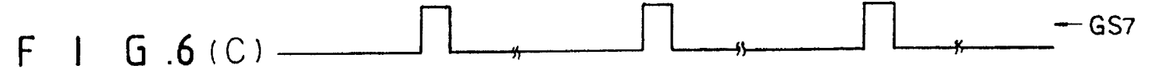
Figure 6D:
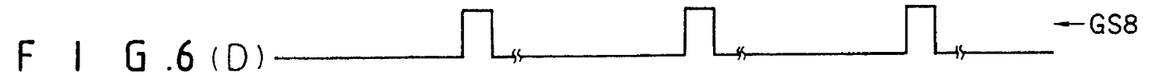
Figure 6E:
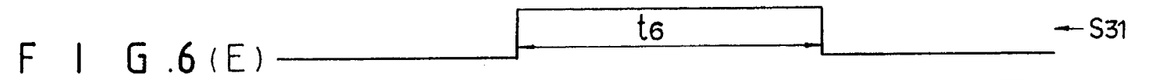
Figure 6F:
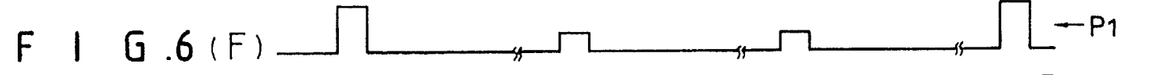

For instance, if the push button switch 31 has been activated for a period of time t6 as shown in FIG. 6E, the voltage at the connection point P1 in the key matrix circuit 7 has, during a period other than the interval t6, a level which is represented by the following equation (1) and as shown in FIG. 6F.

$$V=[(R11+R12+R13+R14+R15)/(R10+R11+R12+R13+R14+R15)]*Vcc \quad (1)$$

Also, during the interval t6, the voltage at the connection point P1 has a level which is represented by the following equation (2), as shown in FIG. 6F.

$$V=[R11/(R10+R11)]*Vcc \quad (2)$$

Figure 6G:
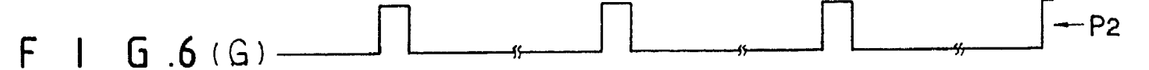
Figure 6H:
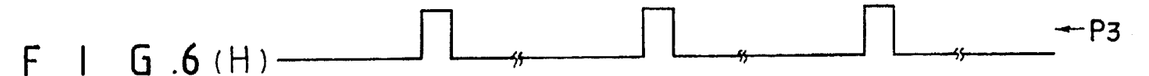
Figure 6I:
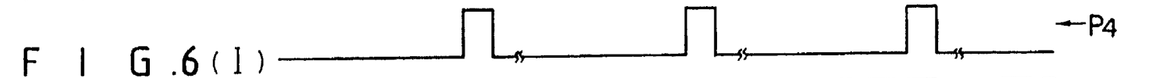

The voltages at the connection points P2–P4 in the key matrix circuit 7, have during respective entire intervals, respective levels which are represented respectively by the following equations (3), (4) and (5), as shown in FIGS. 6G to 6I.

$$V=[(R21+R22+R23+R24+R25)/(R20+R21+R22+R23+R24+R25)]*Vcc \quad (3)$$

$$V=[(R31+R32+R33+R34+R35)/(R30+R31+R32+R33+R34+R35)]*Vcc \quad (4)$$

$$V=[(R41+R42+R43+R44+R45)/(R40+R41+R42+R43+R44+R45)]*Vcc \quad (5)$$

Figure 6J:
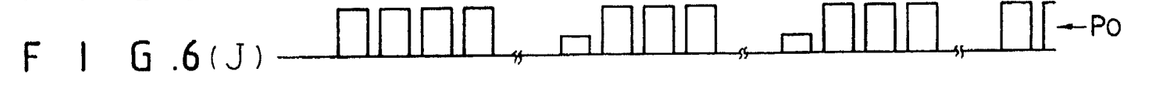

The voltages at the connect ion point s P1–P4 of having levels as mentioned above are combined by the reverse voltage preventing diodes D9–D12 into a key signal as shown in FIG. 6J. This key signal is applied to the input port P0 of the microcomputer 5.

The key signal in FIG. 6J has a voltage level that is reduced by +0.6V by the diodes D9–D12. Although the analog/digital converters 5c1–5c4 are applied simultaneously with the key signal through the input port P0, the conversion of the key signal into digital data is performed by only one of them. The one analog/digital converter is driven by a corresponding one of the grid signals GS5–GS8 having the high level voltage which is applied thereto as one of the clock signals CK1–CK4. The digital data is temporarily stored in a corresponding one of the input registers 5d1–5d4 and then applied to the microprocessor 5a through the data bus 5e. The microprocessor 5a judges a content of the key signal from the corresponding one of the input, registers 5d1–5d4, and thus, determines which one of the push button switches S30–S34, S40–S44, S50–S54 and S60–S64 has been activated. For example, as shown in FIG. 7 which illustrates key signal input states, if a key signal is applied through the input register 5d1, the microprocessor 5a first recognizes that one of the push button switches S30–S34 has been activated and then determines the content of the key signal to determine which one of the push button switches S30–S34 has been activated.

As hereinbefore described, according to the present invention, a key signal input circuit for a microcomputer is provided that can perform the input of the key signal to the microcomputer through a single port. Therefore, the number of pins of the integrated circuit can be reduced significantly. This enables miniaturization and simplification of the integrated circuit.

Although the preferred embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A key signal input circuit for a microcomputer, said key signal input circuit having a plurality of keys, comprising:

key recognizing means having a single input port, said key recognizing means for outputting, in sequence and at a constant interval, a plurality of grid signals, for receiving different key signals through said single input port synchronously with the grid signals, and for discriminating the received key signals to determine which of said keys have been selected, the key recognizing means including analog-to-digital converting means for digitizing the key signals received through the single input port;

power supply means having a plurality of power supply lines, and responsive to the grid signals from said key recognizing means, for supplying power, in sequence and at a constant interval, through said power supply lines; and key signal generating means having a plurality of sets of said keys coupled, by sets, respectively to said power supply lines, and responsive to the power through said power supply lines and to on and off states of said keys, for applying the different key signals to said key recognizing means.

2. A key signal input circuit for a microcomputer according to claim 1, wherein said key recognizing means includes:

a microprocessor for outputting, in sequence and at the constant interval, the grid signals, and for recognizing corresponding keys that have been selected;

an output register for storing temporarily the grid signals from said microprocessor and outputting the grid signals;

a plurality of analog to digital converters for receiving the different key signals from said key signal generating means simultaneously and the grid signals from said output register, a respectively, as drive clock signals for said analog to digital converters, said plurality of analog to digital converters each converting the received key signals into digital signals for key recognition in said microprocessor synchronously with the drive clock signals; and a plurality of input registers each for storing temporarily a corresponding one of the digital signals from said analog to digital converters and outputting the digital signals to said microprocessor through a data bus.

3. A key signal input circuit for a microprocessor according to claim 1, wherein said power supply means includes:

a DC power source for producing DC power; and a plurality of diodes connected between said DC power source and said key signal generating means, said plurality of diodes conducting in accordance with the grid signals from said key recognizing means, thereby supplying the DC power to said key signal generating means.

4. A key signal input circuit for a microcomputer according to claim 1, wherein said key signal generating means includes:

a plurality of sets of resistors connected, by sets corresponding respectively to said power supply lines, between said power supply means and ground, said resistors of the respective sets being connected in series with respect to one another;

and a plurality of diodes having a nodes connected respectively to said resistor connection points adjacent said power supply means and cathodes connected commonly to said input port of said key recognizing means; and wherein said keys include push button switches connected respectively between the ground and respective connection points of said resistors of the respective sets.

5. A key signal input circuit for a microcomputer according to claim 3, wherein said plurality of diodes have anodes connected respectively to said DC power source and said key recognizing means and cathodes connected respectively to said key signal generating means, for preventing a reverse voltage across the DC power source and the key recognizing means.

6. A key signal input circuit for a microcomputer according to claim 2, wherein said microprocessor recognizes the selected keys in response to the digital signals corresponding to the different key signals from said key signal generating means.

7. A key signal input circuit for a microcomputer according to claim 2, wherein each of the plurality of analog to digital converters corresponds to a respective one of the power supply lines.

8. A key signal input circuit for a microcomputer according to claim 2, wherein the grid signals from the output register are output to respective power supply lines and to respective analog to digital converters as clock signals.

9. A key signal input circuit for a microcomputer according to claim 4, wherein each of the analog to digital converters corresponds to a respective one of the sets of resistors, the microprocessor distinguishing the key signals from different ones of the plurality of sets of resistors according to the corresponding analog to digital converter.

* * * * *

UNITED STATES PATENT AND TRADEMARK OFFICE
CERTIFICATE OF CORRECTION

PATENT NO.   :   5,521,575
DATED        :   May 28, 1996
INVENTOR(S)  :   Bok Hyun PACK It is certified that error appears in the above-indentified patent and that said Letters Patent is hereby corrected as shown below:

Claim 4, Column 8, Line 12, "a nodes" should read --anodes--.

Signed and Sealed this

Thirteenth Day of May, 1997

*Attest:*

BRUCE LEHMAN

*Attesting Officer*        Commissioner of Patents and Trademarks